(12) United States Patent
Ciulla et al.

(10) Patent No.: US 10,176,941 B1
(45) Date of Patent: Jan. 8, 2019

(54) ELECTRONIC DEVICE CONTROLLER ASSEMBLY

(71) Applicants: Nicholas Ciulla, Farmingdale, NJ (US);
Roger Chen, Farmingdale, NJ (US);
Elvis Chen, Farmingdale, NJ (US);
Raymond Tse, Farmingdale, NJ (US)

(72) Inventors: Nicholas Ciulla, Farmingdale, NJ (US);
Roger Chen, Farmingdale, NJ (US);
Elvis Chen, Farmingdale, NJ (US);
Raymond Tse, Farmingdale, NJ (US)

( * ) Notice: Subject to any disclaimer, the term of this patent is extended or adjusted under 35 U.S.C. 154(b) by 0 days.

(21) Appl. No.: 15/666,990

(22) Filed: Aug. 2, 2017

(51) Int. Cl.
| | |
|---|---|
| *A63F 13/24* | (2014.01) |
| *H01H 13/84* | (2006.01) |
| *H05K 5/00* | (2006.01) |
| *H01H 13/70* | (2006.01) |
| *H01H 21/22* | (2006.01) |
| *H01H 89/00* | (2006.01) |
| *G06F 3/0338* | (2013.01) |

(52) U.S. Cl.
CPC ........... *H01H 13/84* (2013.01); *G06F 3/0338* (2013.01); *H01H 13/70* (2013.01); *H01H 21/22* (2013.01); *H01H 89/00* (2013.01); *H05K 5/0017* (2013.01); *H05K 5/0026* (2013.01); *A63F 13/24* (2014.09); *H01H 2221/008* (2013.01); *H01H 2223/04* (2013.01); *H01H 2231/008* (2013.01)

(58) Field of Classification Search
CPC ........ A63F 13/24; H01H 13/84; H01H 13/70; H01H 2223/04; H01H 2231/008; G06F 3/0338

USPC .......................................................... 463/37
See application file for complete search history.

(56) References Cited

U.S. PATENT DOCUMENTS

| | | | |
|---|---|---|---|
| 4,067,431 A | 1/1978 | Whitaker | |
| 4,360,892 A | 11/1982 | Endfield | |
| 4,650,934 A | 3/1987 | Burke | |
| 4,917,513 A * | 4/1990 | Takanashi | B41J 11/58 400/208 |
| 5,642,108 A | 6/1997 | Gopher et al. | |
| 7,113,171 B2 * | 9/2006 | Vayda | G06F 3/0481 345/156 |
| 7,461,356 B2 | 12/2008 | Mitsutake | |
| D631,475 S | 1/2011 | Burke et al. | |
| 8,810,536 B2 * | 8/2014 | McDermid | G06F 1/1626 345/173 |

FOREIGN PATENT DOCUMENTS

WO   WO2005027356   3/2005

* cited by examiner

*Primary Examiner* — Vanessa Girardi

(57) ABSTRACT

An electronic device controller assembly for ergonomic dual-handed control of the electronic device includes a housing. At least one circuit board is positioned in the housing. The at least one circuit board is configured to selectively and operationally couple to the electronic device. Each of a pair of sticks is pivotally coupled to and extends between the upper face of the housing and a bottom of a respective plate. Each plate is configured to position a respective hand of a user. A plurality of first buttons is coupled to the plates. The sticks and the first buttons are operationally coupled to the at least one circuit board. Each first button is configured to be depressed to selectively control a respective function of the electronic device. Each plate is positioned to compel an associated stick to pivot relative to the housing to signal a directional movement.

14 Claims, 4 Drawing Sheets

ELECTRONIC DEVICE CONTROLLER ASSEMBLY

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

(2) Description of Related Art Including Information Disclosed Under 37 CFR 1.97 and 1.98

The disclosure and prior art relates to controller assemblies and more particularly pertains to a new controller assembly for ergonomic dual-handed control of an electronic device.

BRIEF SUMMARY OF THE INVENTION

An embodiment of the disclosure meets the needs presented above by generally comprising a housing. At least one circuit board is positioned in the housing. The at least one circuit board is configured to selectively and operationally couple to an electronic device. Each of a pair of sticks is pivotally coupled to and extends between the upper face of the housing and a bottom of a respective plate. Each plate is configured to position a respective hand of a user. A plurality of first buttons is coupled to the plates. The sticks and the first buttons are operationally coupled to the at least one circuit board. Each first button is configured to be depressed to selectively control a respective function of the electronic device. Each plate is positioned to compel an associated stick to pivot relative to the housing to signal a directional movement.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
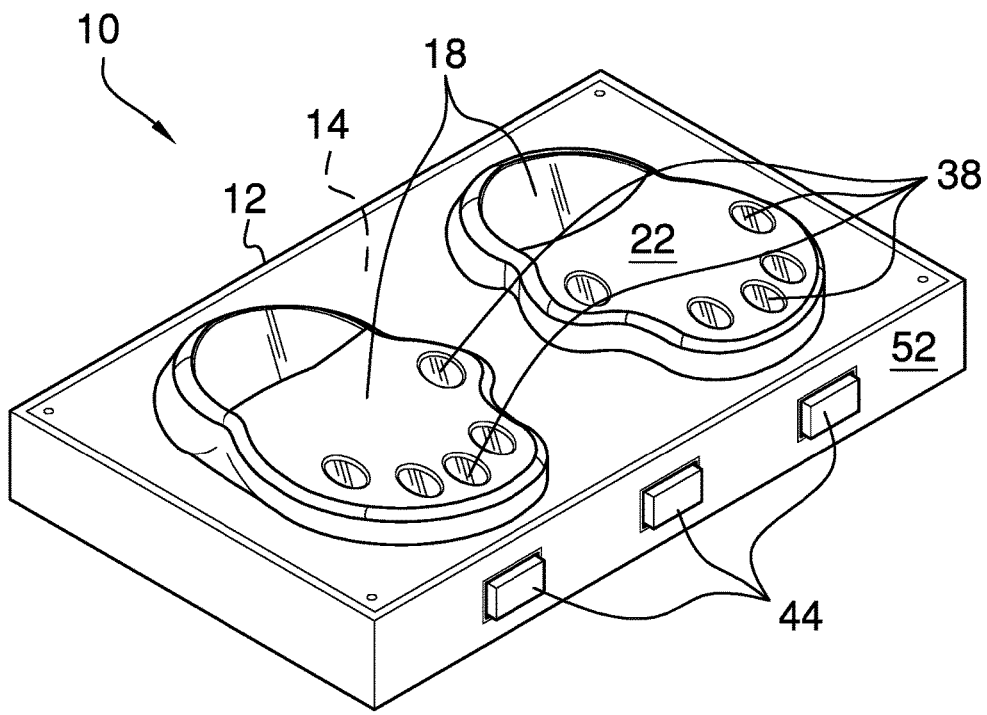
FIG. 1 is an isometric perspective view of an electronic device controller assembly according to an embodiment of the disclosure.
Figure 2:
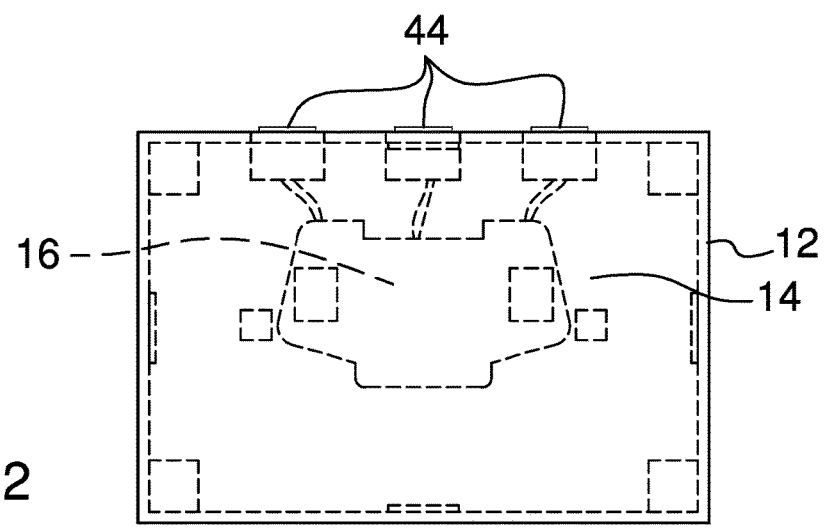
FIG. 2 is a bottom view of an embodiment of the disclosure.
Figure 3:
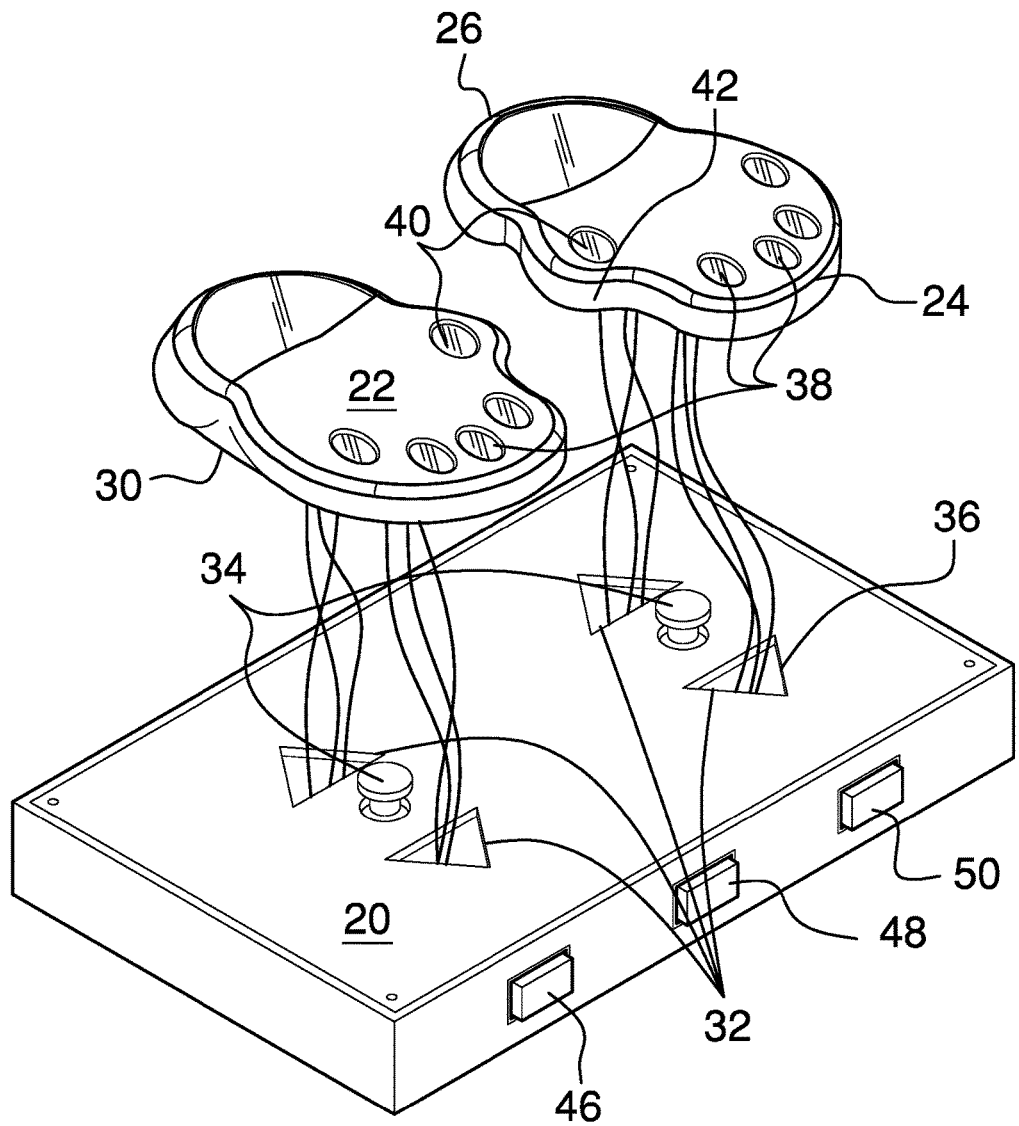
FIG. 3 is an exploded view of an embodiment of the disclosure.
Figure 4:
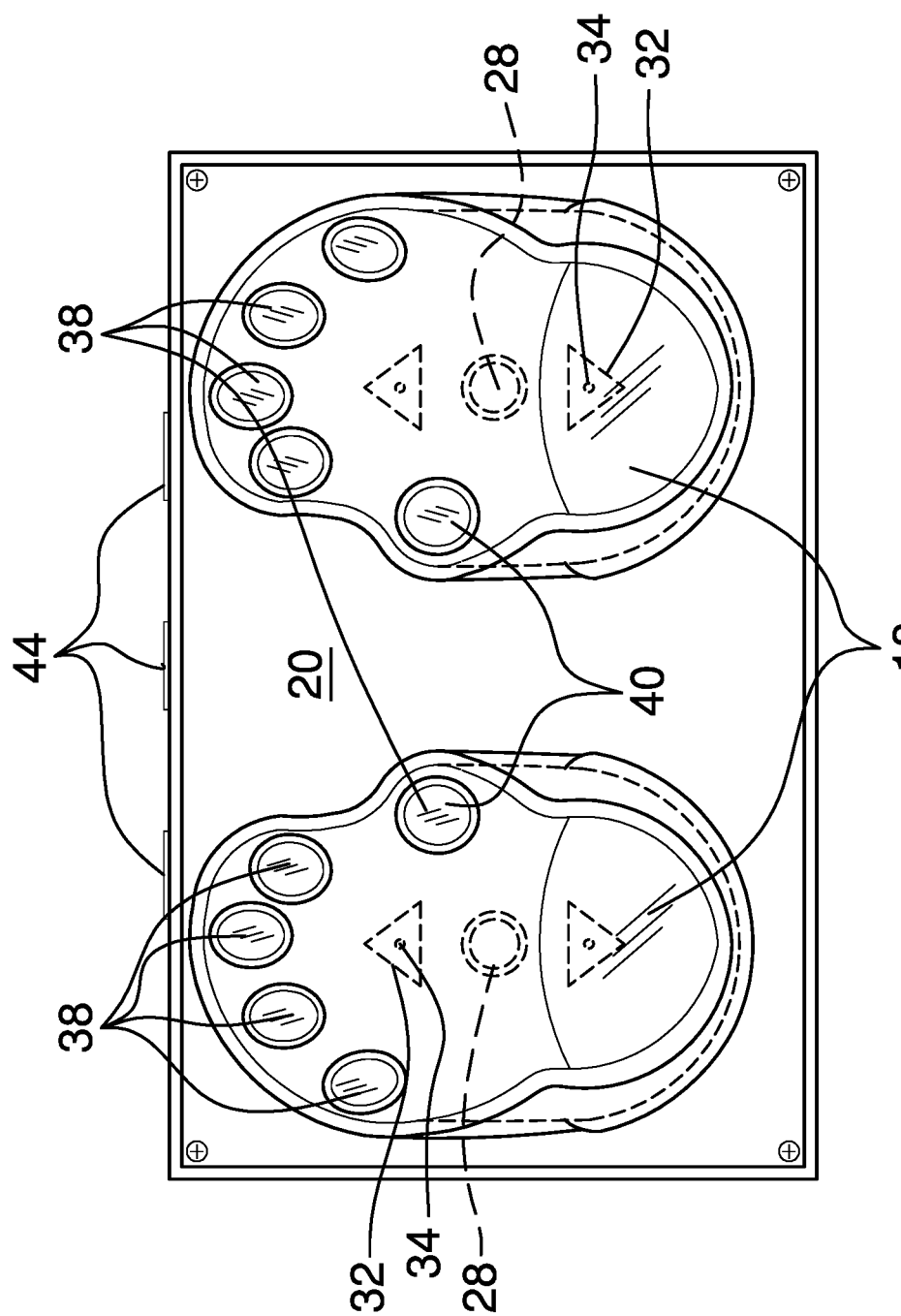
FIG. 4 is a top view of an embodiment of the disclosure.
Figure 5:
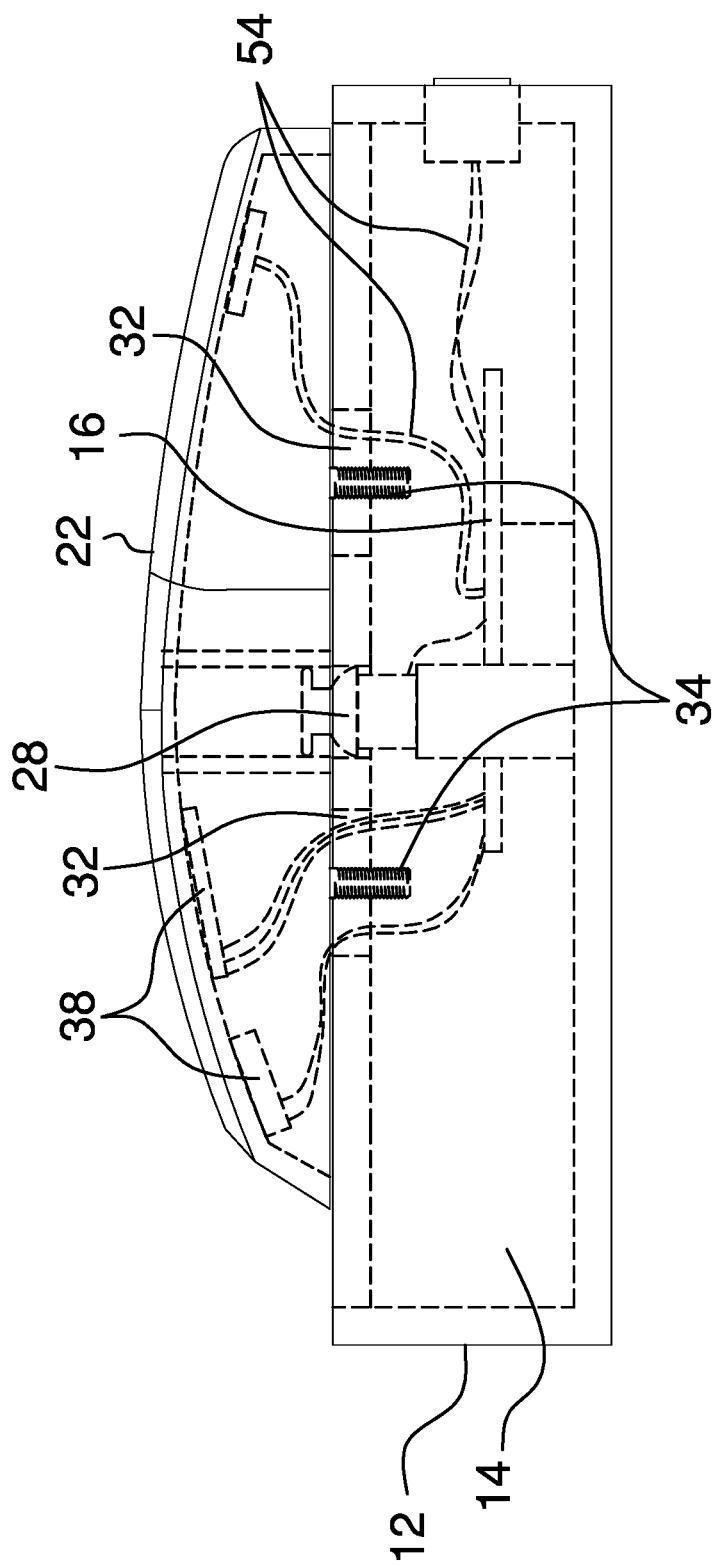
FIG. 5 is a side view of an embodiment of the disclosure.

With reference now to the drawings, and in particular to FIGS. 1 through 5 thereof, a new controller assembly embodying the principles and concepts of an embodiment of the disclosure and generally designated by the reference numeral 10 will be described.

As best illustrated in FIGS. 1 through 5, the electronic device controller assembly 10 generally comprises a housing 12 that defines an internal space 14. In one embodiment, the housing 12 is substantially rectangularly box shaped.

At least one circuit board 16 is coupled to the housing 12 and is positioned in the internal space 14. The at least one circuit board 16 is configured to selectively and operationally couple to an electronic device of a user, such as a gaming console and a computer. In one embodiment, the at least one circuit board 16 is configured to wirelessly operationally couple to the electronic device of the user.

A pair of plates 18 is slidably coupled to upper face 20 of the housing 12. Each plate 18 is configured to position a respective hand of a user. Each plate 18 has a top 22. In one embodiment, the top 22 is convexly arcuate so that the plate 18 is configured to be cupped in the respective hand of the user. Each plate 18 has a first end 24 and a second end 26. In one embodiment, the first end 24 is dimensionally thinner than the second end 26 so that the plate 18 is tapered. In another embodiment, the first end 24 and the second end 26 are arcuate so that the plate 18 is paw shaped.

Each of a pair of sticks 28 is pivotally coupled to and extends between the upper face 20 of the housing 12 and a bottom 30 of a respective plate 18. The sticks 28 are operationally coupled to the at least one circuit board 16. Each plate 18 is configured to be slid relative to the housing 12 such that an associated stick 28 is compelled to pivot relative to the housing 12. The associated stick 28 is compelled to signal a directional movement to the at least one circuit board 16.

Two pairs of penetrations 32 are positioned through the upper face 20 of the housing 12. Each pair of penetrations 32 brackets a respective stick 28. In one embodiment, the penetrations 32 are trigonally shaped.

Each of two pairs of rods 34 is coupled to and extends from the bottom 30 of a respective plate 18. Each rod 34 extends from the respective plate 18 into an associated penetration 32. The pairs of rods 34 are positioned on the plates 18 such that each rod 34 is positioned to contact a perimeter 36 of the associated penetration 32 to limit the slide of the respective plate 18 relative to the housing 12. In one embodiment, the rods 34 are substantially circularly shaped when viewed longitudinally.

Each of a plurality of first buttons 38 is coupled proximate to the first end 24 of a respective plate 18. The first buttons 38 are operationally coupled to the at least one circuit board 16. Each first button 38 is configured to be depressed to selectively control a respective function of the electronic device.

In one embodiment, the plurality of first buttons 38 comprises ten first buttons 38 that are positioned so that each first button 38 is positioned to contact a respective digit of the hands of the user. In another embodiment, the first buttons 38 are substantially ovally shaped. In yet another embodiment, the plurality of first buttons 38 comprises a pair of first knobs 40. Each first knob 40 is positioned on a side 42 of a respective plate 18. The first knob 40 is configured to contact a thumb of the respective hand of the user.

A plurality of second buttons 44 is coupled to a front 52 of the housing 12. The second buttons 44 are operationally coupled to the at least one circuit board 16. Each second button 44 is configured to be depressed to selectively control a respective function of the electronic device. In one embodiment, the plurality of second buttons 44 comprises a second knob 46, a third knob 48, and a fourth knob 50. The second knob 46, the third knob 48, and the fourth knob 50 are configured to be selectively depressed to selectively control Start, Select, and Home functions of the electronic device, respectively.

In use, each plate 18 is configured to be slid relative to the housing 12 so that the associated stick 28 is compelled to pivot relative to the housing 12. The associated stick 28 is compelled to signal a directional movement to the at least one circuit board 16. The pairs of rods 34 are positioned on the plates 18 so that each rod 34 is positioned to contact the perimeter 36 of the associated penetration 32 to limit the slide of the respective plate 18 relative to the housing 12. Each first button 38 is configured to be depressed to selectively control the respective function of the electronic device. The second knob 46, the third knob 48, and the fourth knob 50 are configured to be selectively depressed to selectively control the Start, the Select, and the Home functions of the electronic device, respectively.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

We claim:

1. An electronic device controller assembly comprising:
   a housing defining an internal space;
   at least one circuit board coupled to said housing and positioned in said internal space, said at least one circuit board being configured for selectively operationally coupling to an electronic device of a user, such as a gaming console and a computer;
   a pair of plates slidably coupled to upper face of said housing, each said plate being configured for positioning a respective hand of a user;
   a pair of sticks, each said stick being pivotally coupled to and extending between said upper face of said housing and a bottom of a respective said plate, said sticks being operationally coupled to said at least one circuit board;
   a plurality of first buttons, each said first button being coupled proximate to said first end of a respective said plate, said first buttons being operationally coupled to said at least one circuit board, each said first button being configured for depressing for selectively controlling a respective function of the electronic device; and
   wherein each said plate is positioned on said housing such that said plate is configured for sliding relative to said housing such that an associated said stick is compelled for pivoting relative to said housing such that said associated said stick is compelled for signaling a directional movement to said at least one circuit board, wherein each said first button is positioned on a respective said plate; and
   a plurality of second buttons coupled to a front of said housing, said second buttons being operationally coupled to said at least one circuit board, each said second button being configured for depressing for selectively controlling a respective function of the electronic device.

2. The assembly of claim 1, further including said housing being substantially rectangularly box shaped.

3. The assembly of claim 1, further including said at least one circuit board being configured for wirelessly operationally coupling to the electronic device of the user.

4. The assembly of claim 1, further including each said plate having a top, said top being convexly arcuate such that said plate is configured for cupping in the respective hand of the user.

5. The assembly of claim 1, further including each said plate having a first end and a second end, said first end being dimensionally thinner than said second end such that said plate is tapered.

6. The assembly of claim 1, further including each said plate having a first end and a second end, said first end and said second end being arcuate such that said plate is paw shaped.

7. The assembly of claim 1, further including said plurality of first buttons comprising ten said first buttons positioned such that each said first button is positioned for contacting a respective digit of the hands of the user.

8. The assembly of claim 1, further including said first buttons being substantially ovally shaped.

9. The assembly of claim 1, further including said plurality of first buttons comprising a pair of first knobs, each said first knob being positioned on a side of a respective said plate such that said first knob is configured for contacting a thumb of the respective hand of the user.

10. The assembly of claim 1, further including said plurality of second buttons comprising a second knob, a third knob, and a fourth knob, wherein said second knob, said third knob, and said fourth knob are positioned on said housing such that said second knob, said third knob, and said fourth knob are configured for selectively depressing for selectively controlling Start, Select, and Home functions of the electronic device, respectively.

11. An electronic device controller assembly comprising:
a housing defining an internal space;
at least one circuit board coupled to said housing and positioned in said internal space, said at least one circuit board being configured for selectively operationally coupling to an electronic device of a user, such as a gaming console and a computer;
a pair of plates slidably coupled to upper face of said housing, each said plate being configured for positioning a respective hand of a user;
a pair of sticks, each said stick being pivotally coupled to and extending between said upper face of said housing and a bottom of a respective said plate, said sticks being operationally coupled to said at least one circuit board;
a plurality of first buttons, each said first button being coupled proximate to said first end of a respective said plate, said first buttons being operationally coupled to said at least one circuit board, each said first button being configured for depressing for selectively controlling a respective function of the electronic device;
wherein each said plate is positioned on said housing such that said plate is configured for sliding relative to said housing such that an associated said stick is compelled for pivoting relative to said housing such that said associated said stick is compelled for signaling a directional movement to said at least one circuit board, wherein each said first button is positioned on a respective said plate;
two pairs of penetrations, each said pair of penetrations being positioned through said upper face of said housing such that said pair of penetrations brackets a respective said stick;
two pairs of rods, each said pair of rods being coupled to and extending from said bottom of a respective said plate such that each said rod extends from said respective said plate into an associated said penetration; and
wherein said pairs of rods are positioned on said plates such that each said rod is positioned for contacting a perimeter of said associated said penetration for limiting the sliding of said respective said plate relative to said housing.

12. The assembly of claim 11, further including said penetrations being trigonally shaped.

13. The assembly of claim 11, further including said rods being substantially circularly shaped when viewed longitudinally.

14. An electronic device controller assembly comprising:
a housing defining an internal space, said housing being substantially rectangularly box shaped;
at least one circuit board coupled to said housing and positioned in said internal space, said at least one circuit board being configured for selectively operationally coupling to an electronic device of a user, such as a gaming console and a computer, said at least one circuit board being configured for wirelessly operationally coupling to the electronic device of the user;
a pair of plates slidably coupled to upper face of said housing, each said plate being configured for positioning a respective hand of a user, each said plate having a top, said top being convexly arcuate such that said plate is configured for cupping in the respective hand of the user, each said plate having a first end and a second end, said first end being dimensionally thinner than said second end such that said plate is tapered, said first end and said second end being arcuate such that said plate is paw shaped;
a pair of sticks, each said stick being pivotally coupled to and extending between said upper face of said housing and a bottom of a respective said plate, said sticks being operationally coupled to said at least one circuit board, wherein each said plate is positioned on said housing such that said plate is configured for sliding relative to said housing such that an associated said stick is compelled for pivoting relative to said housing such that said associated said stick is compelled for signaling a directional movement to said at least one circuit board;
two pairs of penetrations, each said pair of penetrations being positioned through said upper face of said housing such that said pair of penetrations brackets a respective said stick, said penetrations being trigonally shaped;
two pairs of rods, each said pair of rods being coupled to and extending from said bottom of a respective said plate such that each said rod extends from said respective said plate into an associated said penetration, wherein said pairs of rods are positioned on said plates such that each said rod is positioned for contacting a perimeter of said associated said penetration for limiting the sliding of said respective said plate relative to said housing, said rods being substantially circularly shaped when viewed longitudinally;
a plurality of first buttons, each said first button being coupled proximate to said first end of a respective said plate, said first buttons being operationally coupled to said at least one circuit board, each said first button being configured for depressing for selectively controlling a respective function of the electronic device, wherein each said first button is positioned on a respective said plate such that said first button is configured for depressing for selectively controlling the respective function of the electronic device, said plurality of first buttons comprising ten said first buttons positioned such that each said first button is positioned for contacting a respective digit of the hands of the user, said first buttons being substantially ovally shaped, said plurality of first buttons comprising a pair of first knobs, each said first knob being positioned on a side of a respective said plate such that said first knob is configured for contacting a thumb of the respective hand of the user;
a plurality of second buttons coupled to a front of said housing, said second buttons being operationally coupled to said at least one circuit board, each said second button being configured for depressing for selectively controlling a respective function of the electronic device, wherein said second buttons are positioned on said housing such that said second buttons are configured for depressing for selectively controlling the respective function of the electronic device, said plurality of second buttons comprising a second knob, a third knob, and a fourth knob, wherein said second knob, said third knob, and said fourth knob are positioned on said housing such that said second knob, said third knob, and said fourth knob are configured for selectively depressing for selectively controlling Start, Select, and Home functions of the electronic device, respectively; and wherein each said plate is positioned on said housing such that said plate is configured for sliding relative to said housing such that said associated said stick is compelled for pivoting relative to said housing such that said associated said stick is compelled for signaling a directional movement to said at least one circuit board, wherein said pairs of rods are positioned on said plates such that each said rod is positioned for contacting a perimeter of said associated said penetration for limiting the sliding of said respective said plate relative to said housing, wherein each said first button is positioned on a respective said plate such that said first button is configured for depressing for selectively controlling the respective function of the electronic device, wherein said second knob, said third knob, and said fourth knob are positioned on said housing such that said knob, said third knob, and said fourth knob are configured for selectively depressing for selectively controlling the Start, the Select and the Home functions of the electronic device, respectively.

\* \* \* \* \*